(12) United States Patent
Lim et al.

(10) Patent No.: US 10,699,653 B2
(45) Date of Patent: Jun. 30, 2020

(54) DISPLAY PANEL AND PIXEL CIRCUIT

(71) Applicant: AU Optronics Corporation, Hsin-Chu (TW)

(72) Inventors: Dong-Hun Lim, Hsin-Chu (TW); Shu-Hao Huang, Hsin-Chu (TW); Chen-Feng Fan, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 106 days.

(21) Appl. No.: 16/119,058

(22) Filed: Aug. 31, 2018

(65) Prior Publication Data

US 2020/0074946 A1 Mar. 5, 2020

(51) Int. Cl.
*G09G 3/36* (2006.01)
*H01L 27/12* (2006.01)
*G02F 1/1343* (2006.01)
*G02F 1/1362* (2006.01)
*G02F 1/1368* (2006.01)
*G02F 1/133* (2006.01)

(52) U.S. Cl.
CPC ......... *G09G 3/3614* (2013.01); *G02F 1/1368* (2013.01); *G02F 1/13306* (2013.01); *G02F 1/13624* (2013.01); *G02F 1/134309* (2013.01); *G02F 1/136286* (2013.01); *H01L 27/124* (2013.01); *H01L 27/1255* (2013.01); *G02F 2001/13685* (2013.01); *G02F 2001/134372* (2013.01); *G09G 3/3677* (2013.01); *G09G 2300/0852* (2013.01); *G09G 2300/0871* (2013.01); *G09G 2310/0243* (2013.01)

(58) Field of Classification Search
CPC ............... G09G 3/3614; G09G 3/3677; G09G 2300/0852; G09G 2300/0871; G09G 2310/0243; G02F 1/13306; G02F 1/134309; G02F 1/13624; G02F 1/136286; G02F 1/1368; G02F 2001/134372; G02F 2001/13685; H01L 27/124; H01L 27/1255
USPC ........................................................ 345/209
See application file for complete search history.

(56) References Cited

U.S. PATENT DOCUMENTS

| 8,674,975 B2 | 3/2014 | Chuang et al. | |
| 9,653,032 B2 | 5/2017 | Lin et al. | |
| 2009/0310047 A1* | 12/2009 | Shin | G09G 3/3659 349/37 |
| 2012/0127142 A1* | 5/2012 | Yoo | G09G 3/3614 345/208 |

(Continued)

FOREIGN PATENT DOCUMENTS

TW 201040935 A 11/2010

*Primary Examiner* — Mark Edwards
(74) *Attorney, Agent, or Firm* — WPAT, PC (57) ABSTRACT

A pixel circuit includes a first switch, a storage circuit, a second switch, and a liquid crystal capacitor. The first node of the first switch is configured to receive a data signal, and the second node of the first switch is coupled with a first node point. The storage circuit is coupled with the first node point, and configured to receive a common voltage. The first node of the second switch is coupled with the storage circuit, and the second node of the second switch is configured to receive a boost signal. The liquid crystal capacitor is coupled between the first node point and the storage circuit. In response to the first switch is conducted, the second switch is conducted, or in response to the second switch is conducted, the first switch is conducted.

19 Claims, 7 Drawing Sheets

(56) References Cited

U.S. PATENT DOCUMENTS

2016/0055817 A1    2/2016   Kuo

* cited by examiner

DISPLAY PANEL AND PIXEL CIRCUIT

BACKGROUND

Field of Invention

The present invention relates to a display panel and a pixel circuit. More particularly, the present invention relates to a liquid crystal pixel circuit having series connected storage capacitors.

Description of Related Art

Among the pixel circuits of the twisted nematic (TN) LCD, in-plane switching (IPS) LCD, and vertical alignment (VA) LCD, the storage capacitor and liquid crystal capacitor are coupled to different electrodes. Therefore, when the data signal is transmitted into the pixel circuit and the electrode connected to the storage capacitor simultaneously provides an AC voltage to the storage capacitor, the electrode connected to the liquid crystal capacitor can provide a DC voltage to stabilize the voltage difference of the liquid crystal capacitor.

However, with respect to the pixel circuit of the fringe-field switching (FFS) LCD, the storage capacitor and liquid crystal capacitor are coupled to the same electrode. When the data signal and the AC voltage are simultaneously transmitted to the two nodes of the liquid crystal capacitor, respectively, the data signal and the AC voltage would interfere with each other because of the capacitor coupling effect. Accordingly, the voltage difference between the two nodes of the liquid crystal capacitor cannot be properly controlled to an expected value.

SUMMARY

The invention provides a display panel. The display panel includes multiple pixel circuits. The multiple pixel circuits are configured to form a pixel array, wherein each pixel circuit includes a first switch, a storage circuit, a second switch, and a liquid crystal capacitor. The first switch includes a first node, a second node, and a control node, wherein the first node of the first switch is configured to receive a data signal, and the second node of the first switch is coupled with a first node point. The storage circuit is coupled with the first node point, and configured to receive a common voltage. The second switch includes a first node, a second node, and a control node, wherein the first node of the second switch is coupled with the storage circuit, and the second node of the second switch is configured to receive a boost signal. The liquid crystal capacitor is coupled between the first node point and the storage circuit. In response to the first switch is conducted, the second switch is conducted, or in response to the second switch is conducted, the first switch is conducted. The pixel array includes multiple rows and columns of the pixel circuit, one of the multiple rows of the pixel circuit includes a first pixel circuit and a second pixel circuit located at two adjacent columns of the pixel circuit, respectively, a first common voltage received by the first pixel circuit and a second common voltage received by the second pixel circuit have voltage polarities opposite to each other.

The invention provides a pixel circuit. The pixel circuit includes a first switch, a storage circuit, a second switch, and a liquid crystal capacitor. The first switch includes a first node, a second node, and a control node, wherein the first node of the first switch is configured to receive a data signal, and the second node of the first switch is coupled with a first node point. The storage circuit is coupled with the first node point, and configured to receive a common voltage. The second switch includes a first node, a second node, and a control node, wherein the first node of the second switch is coupled with the storage circuit, and the second node of the second switch is configured to receive a boost signal. The liquid crystal capacitor is coupled between the first node point and the storage circuit. In response to the first switch is conducted, the second switch is conducted, or in response to the second switch is conducted, the first switch is conducted.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference labels are used in the drawings and the description to refer to the same or like parts, components, or operations.

Figure 1:
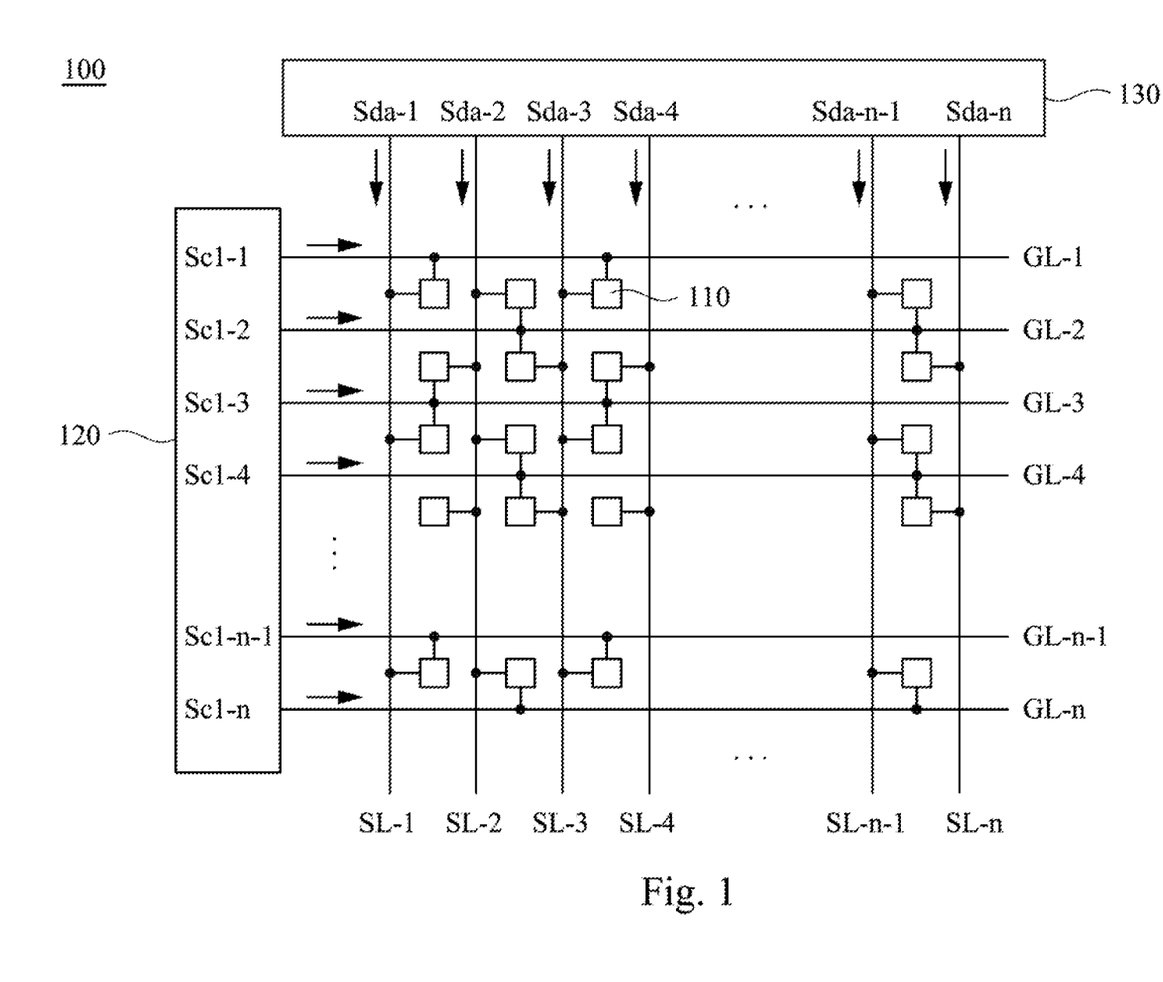
FIG. 1 is a simplified functional block diagram of a display panel according to one embodiment of the present disclosure.

FIG. 1 is a simplified functional block diagram of a display panel 100 according to one embodiment of the present disclosure. The display panel 100 comprises multiple pixel circuits 110, a gate driver 120, a source driver 130, multiple gate lines GL-1~GL-n, and multiple source lines SL-1~SL-n. The pixel circuits 110 are configured to form a pixel array PA, wherein the pixel array PA comprises multiple columns and rows of the pixel circuit 110. For the sake of brevity, other functional blocks of the display panel 100 are not shown in FIG. 1.

The gate lines GL-1~GL-n are configured to provide multiple first control signals Sc1-1~Sc1-n, respectively, to the pixel array PA. The source lines SL-1~SL-n are configured to provide multiple data signals Sda-1~Sda-n, respectively, to the pixel array PA.

Throughout the specification and drawings, indexes 1~n may be used in the reference labels of components and signals for ease of referring to respective components and signals. The use of indexes 1~n does not intend to restrict the amount of components and signals to any specific number. In the specification and drawings, if a reference label of a particular component or signal is used without having the index, it means that the reference label is used to refer to any unspecific component or signals of corresponding component group or signals group. For example, the reference label GL-1 is used to refer to the specific gate line GL-1, and the reference label GL is used to refer to any unspecific gate line of the gate lines GL-1~GL-n. In another example, the reference label Sc1-1 is used to refer to the specific first control signal Sc1-1, and the reference label Sc1 is used to refer to any unspecific first control signal of the first control signals Sc1-1~Sc1-n.

With respect to a row of the pixel circuit 110 of the pixel array PA, the pixel circuits 110 are adjacent to two gate lines GL. The pixel circuits 110 coupled with the odd-numbered source lines SL (e.g., source lines SL-1, SL-3, etc.) are coupled with one of the two gate lines GL. One the other hand, the pixel circuits 110 coupled with the even-numbered source lines SL (e.g., source lines SL-2, SL-4, etc.) are coupled with another one of the two gate lines GL.

For example, with respect to a row of pixel circuit 110 between the gate lines GL-1 and GL-2, the pixel circuits 110 coupled with the odd-numbered source lines SL (e.g., source lines SL-1, SL-3, etc.) are coupled with the gate line GL-1. One the other hand, the pixel circuits 110 coupled with the even-numbered source lines SL (e.g., source lines SL-2, SL-4, etc.) are coupled with the gate line GL-2.

As another example, with respect to the row of pixel circuits 110 between the gate line GL-2 and gate line GL-3, the pixel circuits 110 coupled with the odd-numbered source lines SL (e.g., source lines SL-3, SL-5, etc.) are coupled with the gate line GL-2. One the other hand, the pixel circuits 110 coupled with the even-numbered source lines SL (e.g., source lines SL-2, SL-4, etc.) are coupled with the gate line GL-3.

Figure 2:
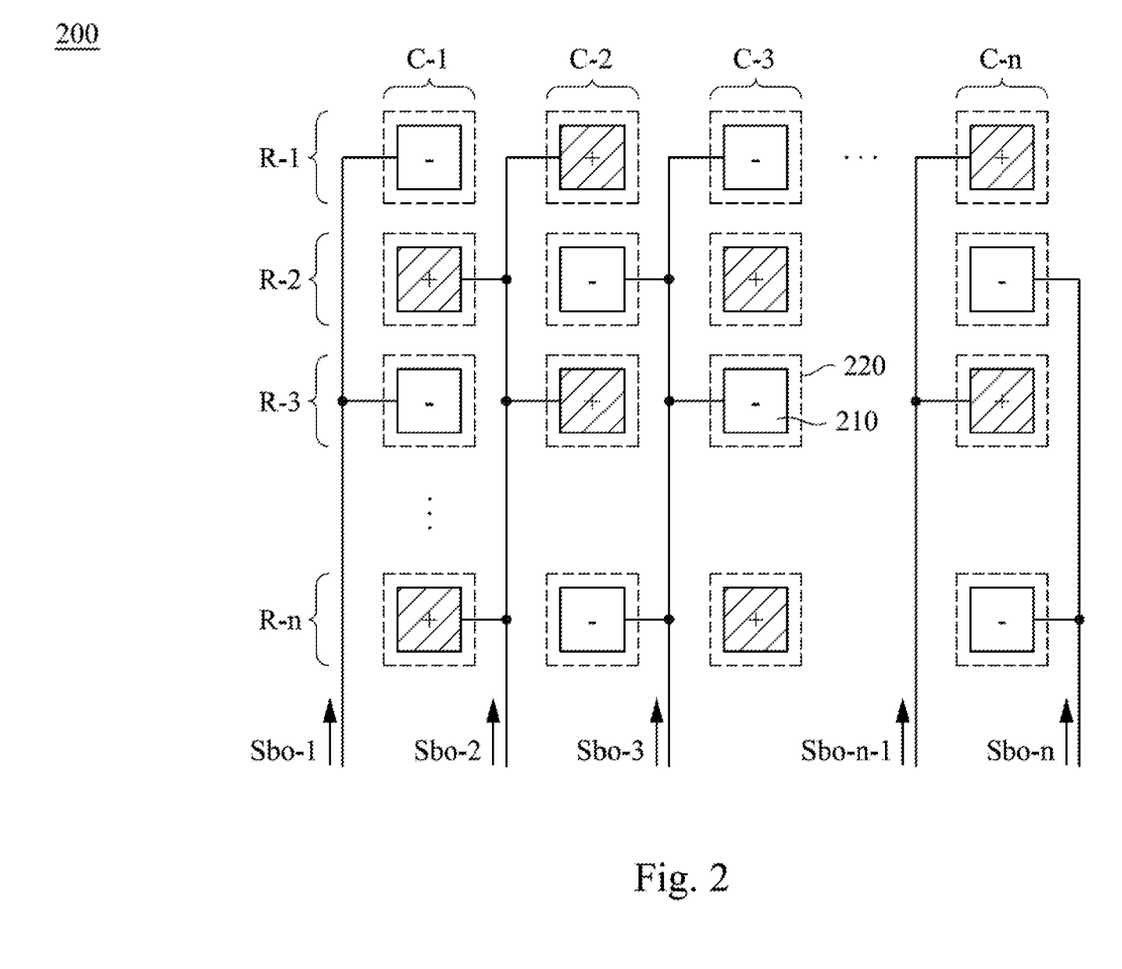
FIG. 2 is a simplified schematic diagram of an electrode array according to one embodiment of the present disclosure.

The display panel 100 further comprises an electrode array 200 as shown in FIG. 2. The electrode array 200 is configured to provide boost signals Sbo-1~Sbo-n to the pixel circuits 110, wherein the boost signals Sbo-1~Sbo-n are configured to cooperatively realize the polarity inversion of the liquid crystal with the data signals Sda-1~Sda-n. Furthermore, the electrode array 200 comprises multiple rows R-1~R-n and columns C-1~C-n of electrode 210.

With respect to column C-1, the electrodes 210 located in the odd-numbered rows R (e.g., rows R-1, R-3, etc.) are coupled together to provide the boost signal Sbo-1.

With respect to columns C-1 and C-2, the electrodes 210 located at the cross points of the column C-1 and the even-numbered rows R (e.g., rows R-2, R-4, etc.) are coupled with the electrodes 210 located at the cross points of the column C-2 and the odd-numbered rows R (e.g., rows R-1, R-3, etc.) to provide the boost signal Sbo-2.

With respect to columns C-2 and C-3, the electrodes 210 located at the cross points of the column C-2 and the even-numbered rows R (e.g., rows R-2, R-4, etc.) are coupled with the electrodes 210 located at the cross points of the column C-3 and the odd-numbered rows R (e.g., rows R-1, R-3, etc.) to provide the boost signal Sbo-3, and so on.

The electrode array 200 further comprises multiple pixel areas 220, wherein each pixel area 220 represents an area that the pixel circuit 110 and the electrode 210 may be configured to locate in. That is, each pixel area 220 comprises a set of coupled electrode 210 and pixel circuit 110.

As shown in FIG. 2, each electrode 210 has multiple adjacent electrodes. In the situation that the electrode 210 and the adjacent electrodes are located in the same row or column, the electrode 210 has the voltage polarity that is opposite to the voltage polarities of the adjacent electrodes. In the situation that the electrode 210 and the adjacent electrodes are located in the different rows or columns, the electrode 210 has the voltage polarity that is the same as the voltage polarities of the adjacent electrodes.

For example, the electrode 210 located at the cross point of row R-2 and column C-2, hereinafter refers to as the target electrode, has eight adjacent electrodes. Among the eight adjacent electrodes, the two adjacent electrodes located in row R-2 and the two adjacent electrodes located in column C-2 have voltage polarities different from that of the target electrode. The other four adjacent electrodes located at the cross points of row R-1 and column C-1, row R-1 and column C-3, row R-3 and column C-1, and row R-3 and column C-3, respectively, have voltage polarities the same as that of the target electrode.

Therefore, among a row of pixel circuit 110 of the pixel array PA, two pixel circuits 110 located at two adjacent columns, respectively, may receive boost signals Sbo that have opposite voltage polarities. That is, the pixel array PA may be driven by using the dot inversion method.

Figure 3:
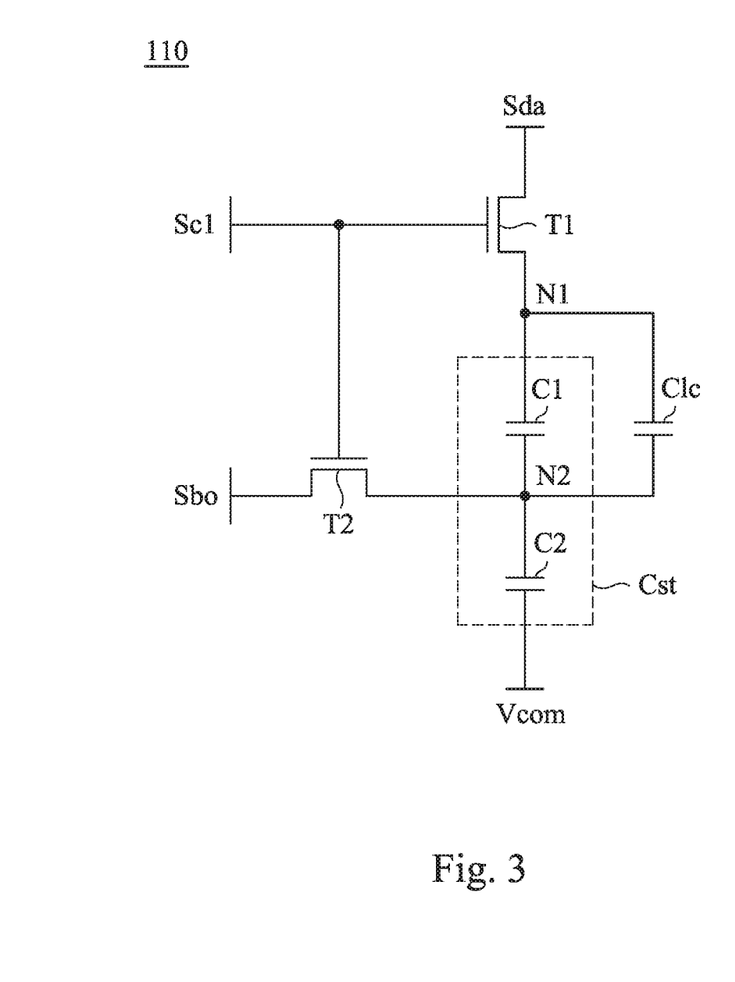
FIG. 3 is a simplified schematic diagram of a pixel circuit according to one embodiment of the present disclosure.

FIG. 3 is a simplified schematic diagram of the pixel circuit 110 according to one embodiment of the present disclosure. The pixel circuit 110 comprises a first switch T1, a second switch T2, a storage circuit Cst, and a liquid crystal capacitor Clc.

The first switch T1 comprises a first node, a second node, and a control node. The first node of the first switch T1 is configured to receive the data signal Sda. The second node of the first switch T1 is coupled with a first node point N1.

The storage circuit Cst is coupled with the first node point N1, and is configured to receive a common voltage Vcom. The liquid crystal capacitor Clc is coupled between the first node point N1 and the storage circuit Cst.

The second switch T2 comprises a first node, a second node, and a control node. The first node of the second switch T2 is coupled with the storage circuit Cst. The second node of the second switch T2 is configured to receive the boost signal Sbo. In response to one of the first switch T1 and the second switch T2 is conducted, the other one of the first switch T1 and the second switch T2 would be conducted, so as to transmit the data signal Sda and boost signal Sbo to the storage circuit Cst and the liquid crystal capacitor Clc.

Specifically, the storage circuit Cst comprises a first capacitor C1 and a second capacitor C2. The first capacitor C1 comprises a first node and a second node. The first node of the first capacitor C1 is coupled with the first node point N1. The second node of the first capacitor C1 is coupled with a second node point N2. The second capacitor C2 comprises a first node and a second node. The first node of the second capacitor C2 is coupled with the second node point N2. The second node of the second capacitor C2 is configured to receive the common voltage Vcom.

It is worth mentioning that the liquid crystal capacitor Clc is coupled between the first node point N1 and the second node point N2.

In this embodiment, the control node of the first switch T1 and the control node of the second switch T2 are coupled with each other, and are both configured to receive the first control signal Sc1. Therefore, the first switch T1 and second switch T2 may be conducted or switched off simultaneously.

In practice, the first switch T1 and second switch T2 may be realized with N-type thin-film transistors or other various suitable N-type transistors.

Figure 4:
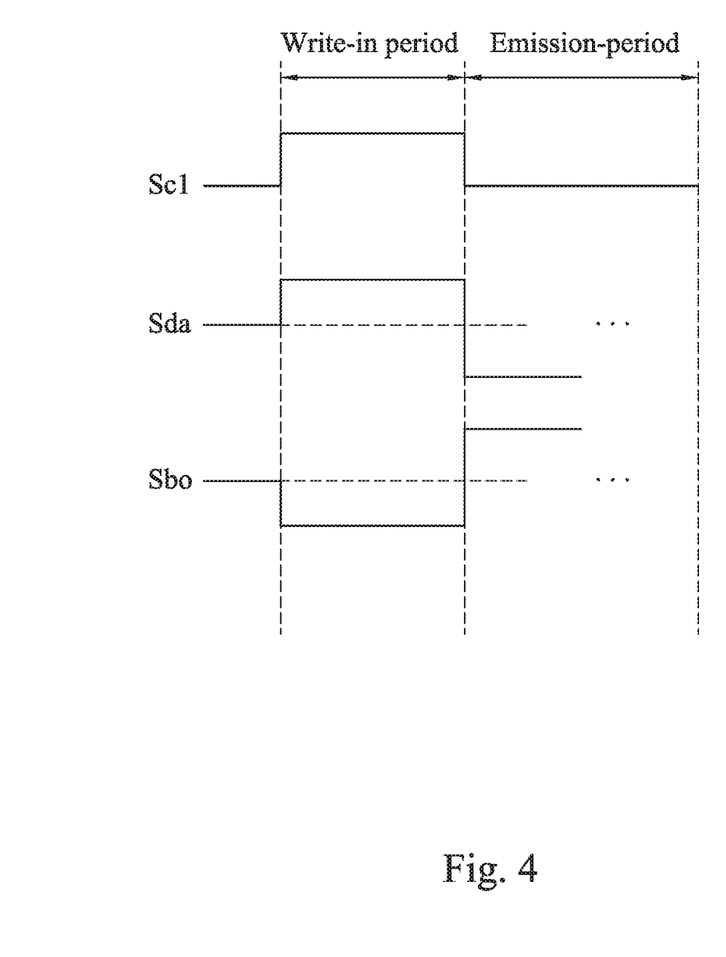
FIG. 4 illustrates schematic waveforms of the first control signal, the data signal, and the boost signal according to one operative embodiment of the pixel circuit.

The operations of the pixel circuit 110 will be further described in the following by reference to FIGS. 3 and 4. As shown in FIG. 4, during a write-in period, the first control signal Sc1 is at an enable level (e.g., a high voltage level), and thus the first switch T1 and second switch T2 are both conducted. In this situation, the data signal Sda is transmitted to the first node point N1 through the first switch T1, and the boost signal Sbo is transmitted to the second node point N2 through the second switch T2.

Then, during an emission period, the first control signal Sc1 is at a disable level, and thus the first switch T1 and second switch T2 are both switched off.

In this embodiment, the phase of the boost signal Sbo is opposite to the phase of the data signal Sda, while the absolute value of the magnitude of the boost signal Sbo is the same as the absolute value of the magnitude of the data signal Sda.

During the write-in period of a first frame, for example, when the voltage level of the data signal Sda is 4 V, the voltage level of the boost signal Sbo may be −4 V. Therefore, a positive voltage difference (i.e., 8 V) may be realized between the two nodes of the liquid crystal capacitor Clc. During the write-in period of a second frame following the first frame, when the voltage level of the data signal Sda is −2.2 V, the voltage level of the boost signal Sbo may be 2.2 V. Therefore, a negative voltage difference (i.e., −4.4 V) may be realized between the two nodes of the liquid crystal capacitor Clc, and the polarity inversion of the liquid crystal can be achieved.

In some embodiments, the first switch T1 and second switch T2 may be realized with P-type transistors. In this situation, the enable level of the first control signal Sc1 is the low voltage level, and the disable level of the first control signal Sc1 is the high voltage level.

Figure 5:
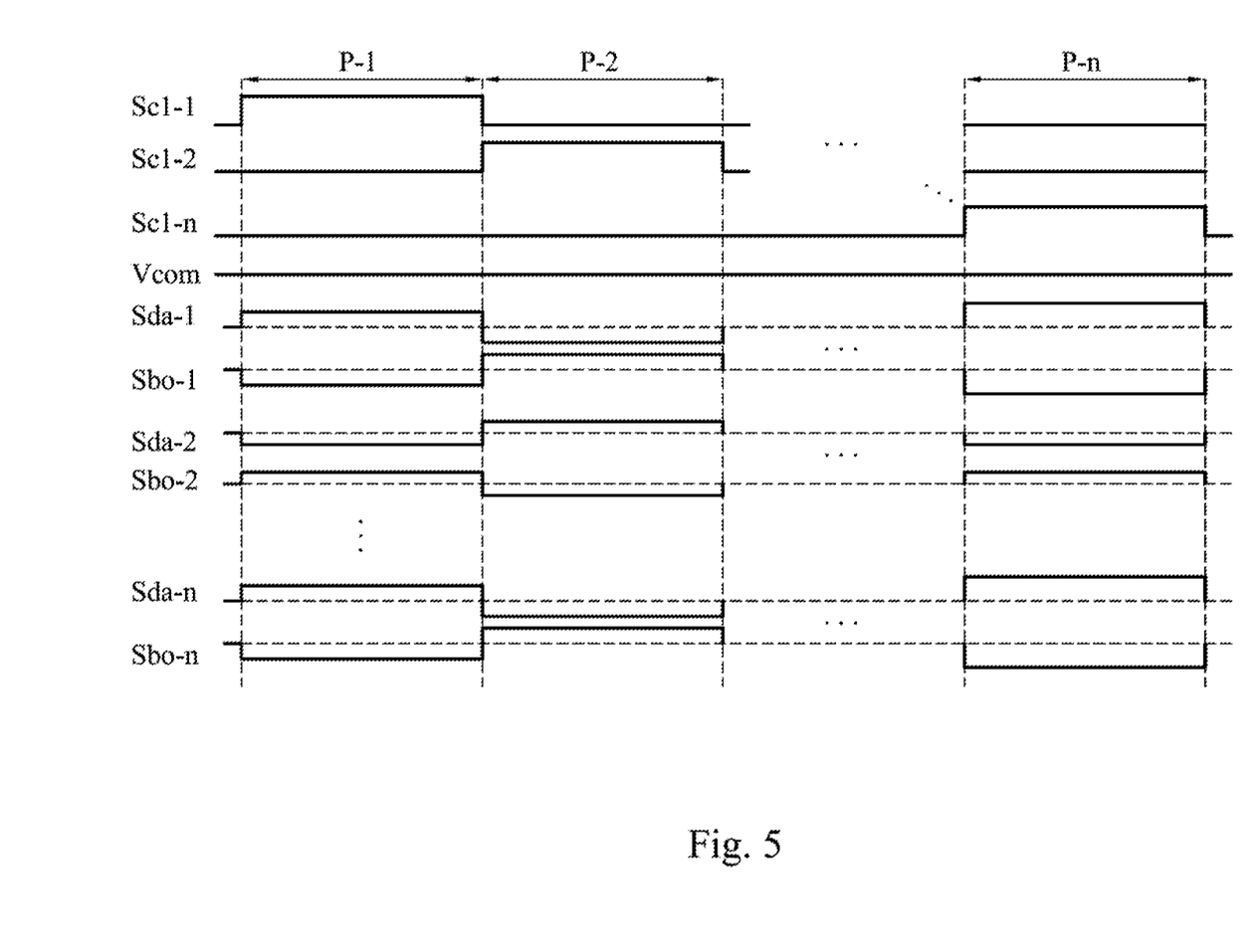
FIG. 5 illustrates schematic waveforms of the first control signals, the data signals, the boost signals, and the common voltage according to one operative embodiment of the display panel.

FIG. 5 illustrates schematic waveforms of the first control signals Sc-1~Sc-n, the data signals Sda-1~Sda-n, the boost signals Sbo-1~Sbo-n, and the common voltage Vcom according to one operative embodiment of the display panel 100 within a frame period. As shown in FIG. 5, a frame period may be divided into n sub-periods P-1~P-n, wherein n is a positive number and equal to the amount of the gate lines GL-1~GL-n. Among the sub-periods P-1~P-n, the first control signals Sc1-1~Sc-n sequentially switch from the disable level to the enable level.

For example, during the sub-period P-1, the first control signal Sc1-1 is at the enable level, and the other first control signals Sc1-2~Sc1-n are at the disable level. During the sub-period P-2, the first control signal Sc1-2 is at the enable level, and the other first control signals Sc1-1 and Sc1-3~Sc1-n are at the disable level. During the sub-period P-3, the first control signal Sc1-3 is at the enable level, and the other first control signals Sc1-1, Sc1-2 and Sc1-4~Sc1-n are at the disable level, and so on.

When each of the sub-periods P-1~P-n starts, the data signal Sda and boost signal Sbo may change their voltage levels, while the common voltage Vcom remains at a constant voltage level. That is, during each frame period, the voltage level of the data signal Sda or boost signal Sbo may be changed n times.

Figure 6:
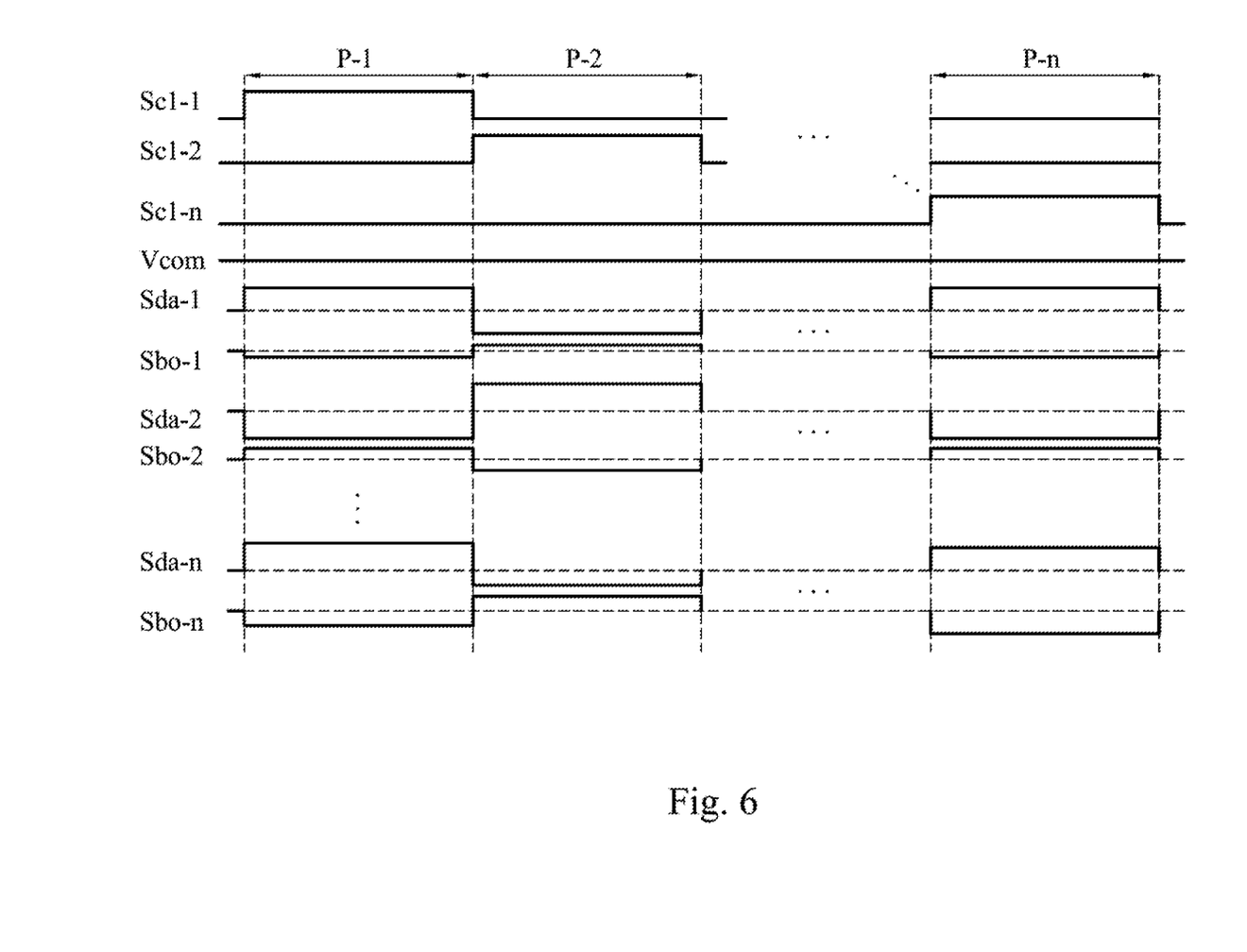
FIG. 6 illustrates schematic waveforms of the first control signals, the data signals, the boost signals, and the common voltage according to another operative embodiment of the display panel within a frame period.

In other embodiments, as shown in FIG. 6, the boost signal Sbo switches between multiple predetermined voltage levels. That is, the absolute value of the magnitude of the boost signal Sbo may be different from the absolute value of the magnitude of the data signal Sda.

Figure 7:
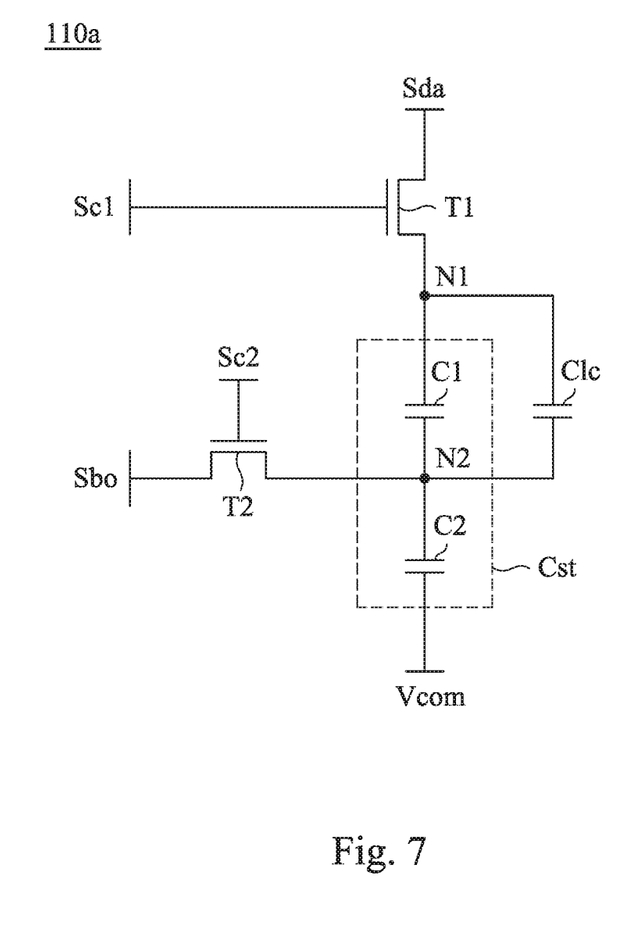
FIG. 7 is a simplified schematic diagram of a pixel circuit according to another embodiment of the present disclosure.

FIG. 7 is a simplified schematic diagram of a pixel circuit 110a according to another embodiment of the present disclosure. Pixel circuit 110a is similar to the pixel circuit 110, the difference is that the control node of the first switch T1 and the control node of the second switch T2 are not coupled with each other. The control node of the first switch T1 is configured to receive the first control signal Sc1, while the control node of the second switch T2 is configured to receive a second control signal Sc2 provided by the gate driver 120. The first switch T1 and second switch T2 may be switched simultaneously, or be switched separately.

In some embodiments, for example, the first control signal Sc1 may first switches from the disable level to the enable level, and then the second control signal Sc2 switches from the disable level to the enable level. Therefore, the first switch T1 is first conducted, and then the second switch T2 is conducted.

In other embodiments, the second control signal Sc2 may first switches from the disable level to the enable level, and then the first control signal Sc1 switches from the disable level to the enable level. Therefore, the second switch T2 is first conducted, and then the first switch T1 is conducted.

The foregoing descriptions regarding the implementations, connections, operations, and related advantages of other corresponding components in the pixel circuit 110 are also applicable to the pixel circuit 110a. For the sake of brevity, those descriptions will not be repeated here.

Figure 8:
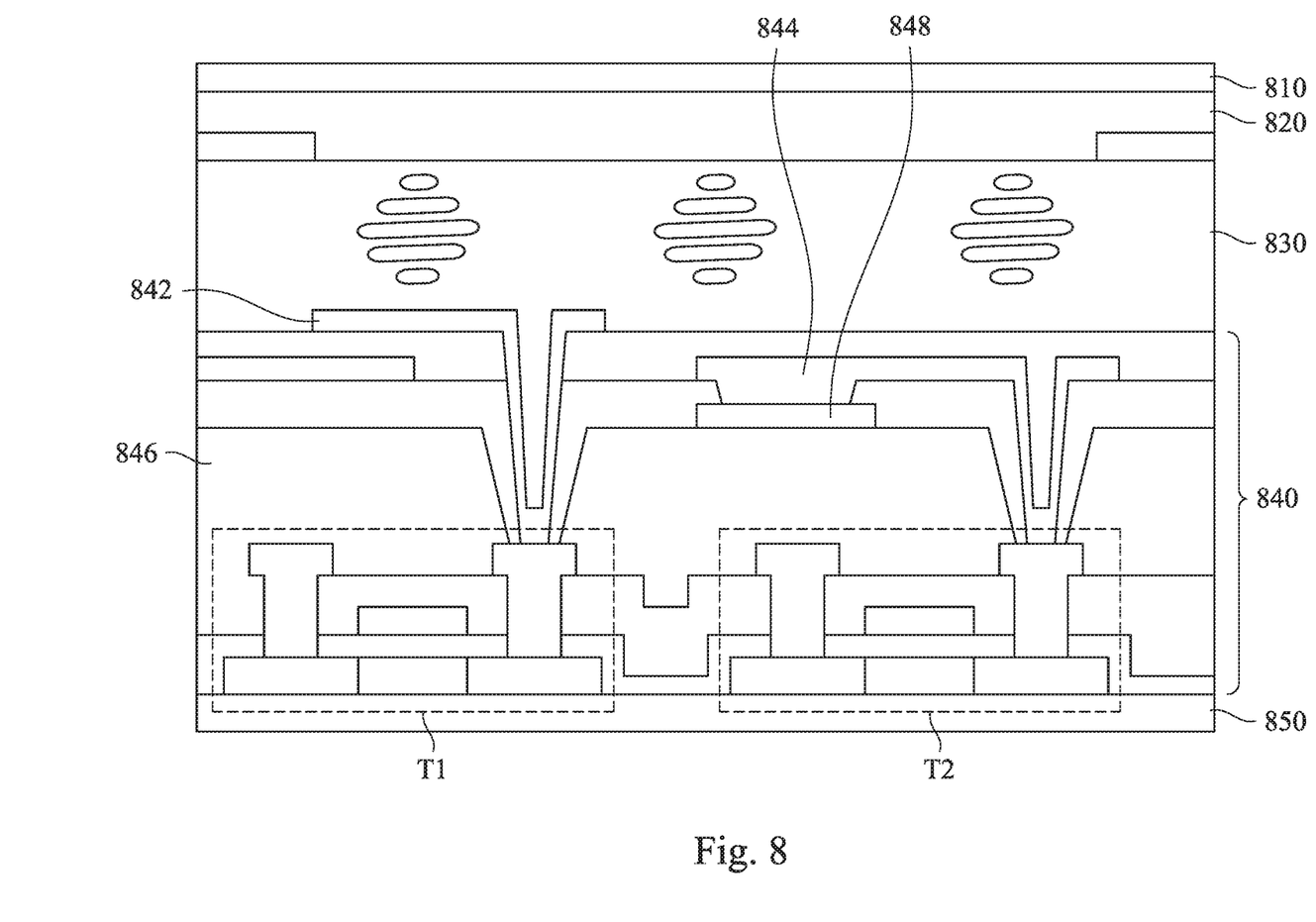
FIG. 8 is a simplified cross-sectional diagram of a fringe-field switching liquid crystal cell according to one embodiment of the present disclosure.

In some embodiments, the display panel 100 comprises multiple fringe-field switching (FFS) liquid crystal cells (not shown in FIG. 1). Each FFS liquid crystal cell, as shown in FIG. 8, comprises an over coating (OC) layer 810, a color filter layer 820, a liquid crystal layer 830, a thin film transistor layer 840, and a shielding layer 850. For the sake of brevity, other components of the FFS liquid crystal cell are not shown in FIG. 8.

The thin film transistor layer 840 comprises a first indium tin oxide (ITO) layer 842, a second ITO layer 844, a passivation layer 846, a metal layer 848, the first switch T1, and the second switch T2. The first ITO layer 842 is coupled to the first node of the first switch T1, and configured to transmit the data signal Sda to the first switch T1. The metal layer 848 is coupled to the second node of the second switch T2 through the second ITO layer 844, and configured to transmit the boost signal Sbo to the second switch T2 through the second ITO layer 844.

The first switch T1 and the switch T2 of the FFS liquid crystal cell may be the first switch T1 and the switch T2 of the pixel circuit 110 or 110a. That is, the pixel circuit 110 or 110a forms part of the FFS liquid crystal cell.

As can be appreciated from the foregoing embodiments, when the data signal Sda and the boost signal Sbo are simultaneously transmitted into the pixel circuit 110 or 110a, the common voltage Vcom and the second capacitor C2 can cooperatively stabilize the voltage level of the second node point N2. Therefore, the voltage difference between the two nodes of the liquid crystal capacitor Clc can be properly controlled to an expected value.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A display panel, comprising:
a plurality of pixel circuits, configured to form a pixel array, wherein each pixel circuit comprises:
a first switch, comprising a first node, a second node, and a control node, wherein the first node of the first switch is configured to receive a data signal, and the second node of the first switch is coupled with a first node point;
a storage circuit, coupled with the first node point, and configured to receive a common voltage;
a second switch, comprising a first node, a second node, and a control node, wherein the first node of the second switch is coupled with the storage circuit, and the second node of the second switch is configured to receive a corresponding one of a plurality of boost signals; and
a liquid crystal capacitor, coupled between the first node point and the storage circuit;
wherein in response to the first switch is conducted, the second switch is conducted, or
in response to the second switch is conducted, the first switch is conducted;
wherein the pixel array comprises a plurality of rows and a plurality of columns of the pixel circuit, one of the plurality of rows of the pixel circuit comprises a first pixel circuit and a second pixel circuit located in two adjacent columns of the pixel circuit, respectively, a first boost signal of the plurality of boost signals received by the second switch of the first pixel circuit and a second boost signal of the plurality of boost signals received by the second switch of the second pixel circuit have voltage polarities opposite to each other.

2. The display panel of claim 1, wherein the storage circuit comprises:
a first capacitor, comprising a first node and a second node, wherein the first node of the first capacitor is coupled with the first node point, and the second node of the first capacitor is coupled with a second node point; and
a second capacitor, comprising a first node and a second node, wherein the first node of the second capacitor is coupled with the second node point, and the second node of the second capacitor is configured to receive the common voltage;
wherein the liquid crystal capacitor is coupled between the first node point and the second node point.

3. The display panel of claim 2, wherein the control node of the first switch is coupled with the control node of the second switch, and the control node of the first switch and the control node of the second switch are configured to receive a first control signal.

4. The display panel of claim 3, wherein a phase of the corresponding one of the plurality of boost signals is opposite to a phase of the data signal.

5. The display panel of claim 4, wherein an absolute value of magnitude of the corresponding one of the plurality of boost signals is the same as an absolute value of magnitude of the data signal.

6. The display panel of claim 4, wherein the corresponding one of the plurality of boost signals switches between multiple predetermined voltage levels.

7. The display panel of claim 4, further comprising:
a plurality of gate lines, wherein one of the plurality of gate lines is configured to provide the first control signal;
wherein during each frame period, a voltage level of the corresponding one of the plurality of boost signals is changed n times, n is the same as an amount of the plurality of gate lines, and n is a positive integer.

8. The display panel of claim 2, wherein the control node of the first switch is configured to receive a first control signal, and the control node of the second switch is configured to receive a second control signal, wherein the first control signal is different from the second control signal.

9. The display panel of claim 8, wherein the first control signal first switches from a disable level to an enable level, then the second control signal switches from the disable level to the enable level, or
the second control signal first switches from the disable level to the enable level, then the first control signal switches from the disable level to the enable level.

10. The display panel of claim 1, wherein the display panel further comprises a plurality of fringe-field switching liquid crystal cells, and each of the pixel circuits forms part of one of the plurality of fringe-field switching liquid crystal cells.

11. The display panel of claim 1, wherein the pixel array is configured to be driven by using a dot inversion method.

12. A pixel circuit, comprising:
a first switch, comprising a first node, a second node, and a control node, wherein the first node of the first switch is configured to receive a data signal, and the second node of the first switch is coupled with a first node point;
a storage circuit, comprising:
a first capacitor, comprising a first node and a second node, wherein the first node of the first capacitor is coupled with the first node point, and the second node of the first capacitor is coupled with a second node point; and
a second capacitor, comprising a first node and a second node, wherein the first node of the second capacitor is coupled with the second node point, and the second node of the second capacitor is configured to receive a common voltage;
a second switch, comprising a first node, a second node, and a control node, wherein the first node of the second switch is coupled with the second node point, and the second node of the second switch is configured to receive a boost signal; and
a liquid crystal capacitor, coupled between the first node point and the second node point;

wherein in response to the first switch is conducted, the second switch is conducted, or in response to the second switch is conducted, the first switch is conducted.

13. The pixel circuit of claim 12, wherein the control node of the first switch is coupled with the control node of the second switch, and the control node of the first switch and the control node of the second switch are configured to receive a first control signal.

14. The pixel circuit of claim 13, wherein a phase of the boost signal is opposite to a phase of the data signal.

15. The pixel circuit of claim 14, wherein an absolute value of magnitude of the boost signal is the same as an absolute value of magnitude of the data signal.

16. The pixel circuit of claim 14, wherein the boost signal switches between multiple predetermined voltage levels.

17. The pixel circuit of claim 14, wherein the pixel circuit is configured in a display panel, the display panel comprises a plurality of gate lines, and one of the plurality of gate lines is configured to provide the first control signal;

wherein during each frame period, a voltage level of the boost signal is changed n times, n is the same as an amount of the plurality of gate lines, and n is a positive integer.

18. The pixel circuit of claim 12, wherein the control node of the first switch is configured to receive a first control signal, and the control node of the second switch is configured to receive a second control signal, wherein the first control signal is different from the second control signal.

19. The pixel circuit of claim 18, wherein the first control signal first switches from a disable level to an enable level, then the second control signal switches from the disable level to the enable level, or the second control signal first switches from the disable level to the enable level, then the first control signal switches from the disable level to the enable level.

\* \* \* \* \*